United States Patent
Wu et al.

(10) Patent No.: US 11,829,605 B2
(45) Date of Patent: Nov. 28, 2023

(54) MEMORY DEVICE WITH REDUNDANT MEMORY CIRCUIT AND REPAIR METHOD THEREOF

(71) Applicants: Jiangsu Advanced Memory Technology Co., Ltd., Jiangsu (CN); Siloam Holdings Co., Ltd., Hsinchu County (TW)

(72) Inventors: Jui-Jen Wu, Hsinchu County (TW); Toshio Sunaga, Hsinchu County (TW); Tzu-Hao Yang, Hsinchu County (TW)

(73) Assignees: JIANGSU ADVANCED MEMORY TECHNOLOGY CO., LTD., Jiangsu (CN); SILOAM HOLDINGS CO., LTD., Hsinchu County (TW)

( * ) Notice: Subject to any disclaimer, the term of this patent is extended or adjusted under 35 U.S.C. 154(b) by 0 days.

(21) Appl. No.: 17/239,712

(22) Filed: Apr. 26, 2021

(65) Prior Publication Data
US 2022/0300167 A1 Sep. 22, 2022

(30) Foreign Application Priority Data
Mar. 16, 2021 (CN) .......................... 202110282028.9

(51) Int. Cl.
*G06F 3/06* (2006.01)
(52) U.S. Cl.
CPC .......... *G06F 3/0619* (2013.01); *G06F 3/0646* (2013.01); *G06F 3/0673* (2013.01)

(58) Field of Classification Search
CPC ..... G06F 3/0619; G06F 3/0646; G06F 3/0673
See application file for complete search history.

(56) References Cited

U.S. PATENT DOCUMENTS

| | | | |
|---|---|---|---|
| 6,295,237 B1* | 9/2001 | Pochmuller | G11C 29/44 365/201 |
| 6,732,291 B1* | 5/2004 | Kilmer | G06F 11/1008 714/6.32 |
| 2016/0189800 A1* | 6/2016 | Ryu | G11C 29/40 365/96 |
| 2020/0411089 A1* | 12/2020 | Chawla | G11C 13/0026 |

* cited by examiner

*Primary Examiner* — William E. Baughman
(74) *Attorney, Agent, or Firm* — CKC & Partners Co., LLC

(57) ABSTRACT

A memory device includes several normal memory circuits and a redundant memory circuit is disclosed. The several normal memory circuits include several normal memory arrays. The redundant memory circuit includes a redundant memory array. The several normal memory arrays share the redundant memory array. When a first normal memory cell of a first normal memory array of the several normal memory arrays is destructed, a first redundant memory cell of the redundant memory array replaces the first normal memory cell. When a second normal memory cell of a second normal memory array of the several normal memory arrays is destructed, a second redundant memory cell of the redundant memory array replaces the second normal memory cell.

8 Claims, 6 Drawing Sheets

MEMORY DEVICE WITH REDUNDANT MEMORY CIRCUIT AND REPAIR METHOD THEREOF

CROSS-REFERENCE TO RELATED APPLICATION

This application claims the priority benefit of Chinese Application serial no. 202110282028.9, filed Mar. 16, 2021, the full disclosure of which is incorporated herein by reference.

TECHNICAL FIELD

The present disclosure relates to a memory device and a repair method thereof. More particularly, the present disclosure relates to a memory device and a repair method sharing a redundant memory.

DESCRIPTION OF RELATED ART

For large scale memories such as pulse-code modulation variable resistance memory (PCM), resistive random-access memory (ReRAM), static random access memory (SRAM), in some designs, when the memory cell is destructed, the entire memory array is replaced to maintain the function of the memory. However, this will result in higher costs. To solve this problem, the redundant memory was proposed. In this method, the memory array includes redundant memory cells, which is used to replace the destructed normal memory cell when the normal memory cell is destructed. However, in some cases, redundant memory cells may still be insufficient or not effectively used.

SUMMARY

An aspect of the present disclosure is to provide a memory device. The memory device includes several normal memory circuits and a redundant memory circuit. The several normal memory circuits include several normal memory arrays. The redundant memory circuit includes a redundant memory array. The several normal memory arrays share the redundant memory array. When a first normal memory cell of a first normal memory array of the several normal memory arrays is destructed, a first redundant memory cell of the redundant memory array replaces the first normal memory cell. When a second normal memory cell of a second normal memory array of the several normal memory arrays is destructed, a second redundant memory cell of the redundant memory array replaces the second normal memory cell.

Another aspect of the present disclosure is to provide a repair method. The repair method is suitable for a memory device. The memory device includes a first normal memory circuit, a second normal memory circuit and a redundant memory circuit. The repair method includes the following operations: replacing a first normal memory cell by a first redundant memory cell of a redundant memory array of the redundant memory circuit when the first normal memory cell of a first normal memory array of the first normal memory circuit is destructed; and replacing a second normal memory cell by a second redundant memory cell of the redundant memory array when the second normal memory cell of a second normal memory array of the second normal memory circuit is destructed. The first normal memory circuit and the second normal memory circuit share the redundant memory circuit.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
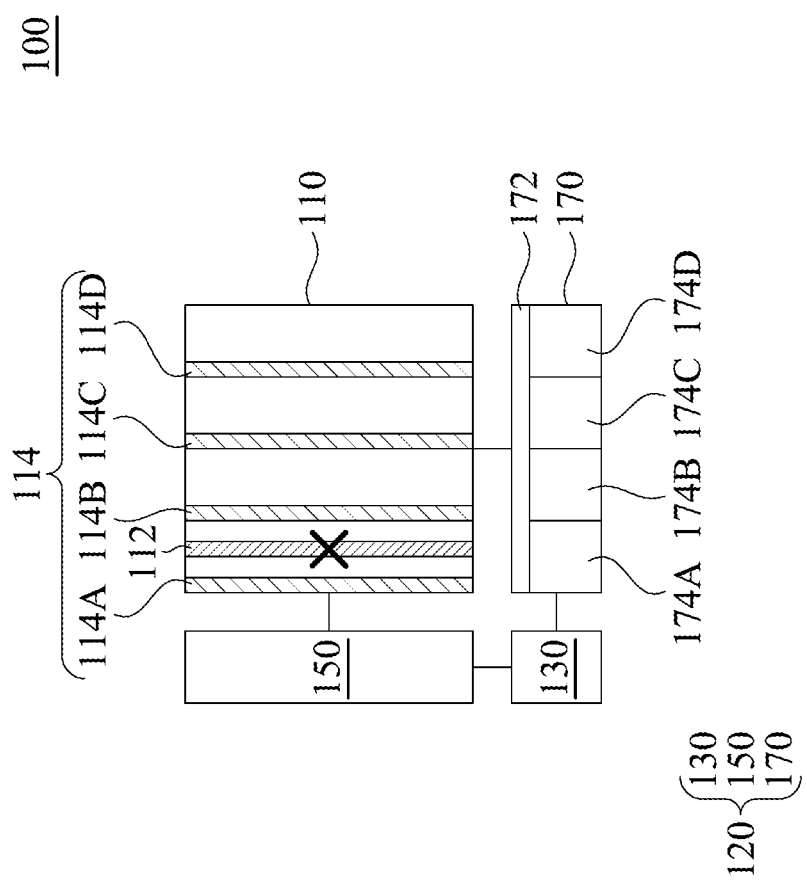
FIG. 1 is a schematic diagram illustrating a memory device according to the prior art.

Reference is made to FIG. 1. FIG. 1 is a schematic diagram illustrating a memory device 100 according to the prior art. As illustrated in FIG. 1, the memory device 100 includes a memory array 110 controlled by the control circuit 120. The control circuit includes a word line circuit 150, a bit line circuit 170 and a sub control circuit 130. The bit line circuit 170 further includes a bit line decoding circuit 172 and read/write circuits 174A to 174D.

As illustrated in FIG. 1, the memory array 110 includes the normal memory cells and the redundant memory cells 114. The redundant memory cells 114 are dispersed at the redundant memory cell columns 114A to 114D. When the normal memory cells include destructed normal memory cells (as illustrated in FIG. 1, the destructed memory cell is located at the normal memory column 112), one of the redundant memory cell 114 replaces the destructed normal memory cell.

However, as illustrated in FIG. 1. When there are more destructed normal memory cells, the number of the redundant memory cells 114 may not be enough to replace normal memory cells.

Figure 2:
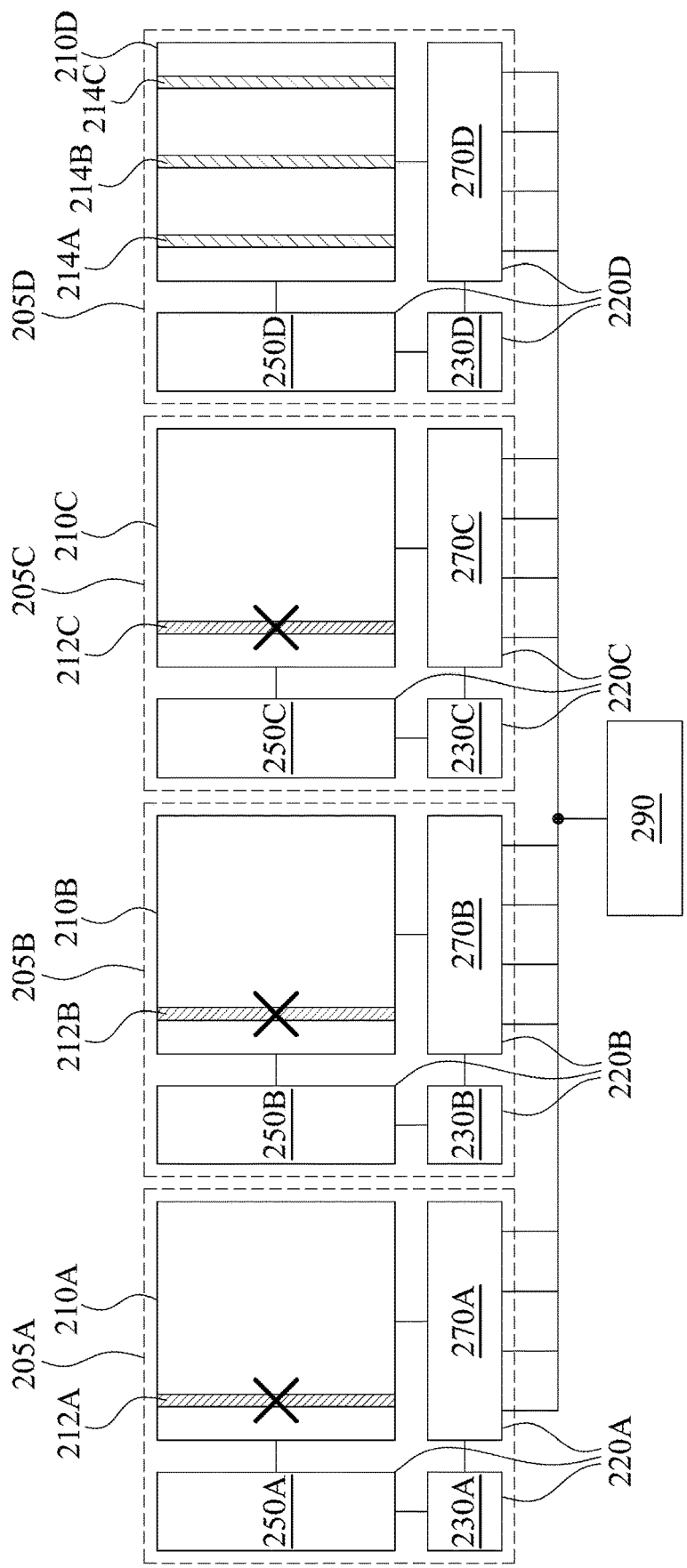
FIG. 2 is a schematic diagram illustrating a memory device according to some embodiments of the present disclosure.

Reference is made to FIG. 2. FIG. 2 is a schematic diagram illustrating a memory device 200 according to some embodiments of the present disclosure.

As illustrated in FIG. 2. The memory device 200 includes several normal memory circuits 205A to 205C and the redundant memory circuit 205D. The normal memory circuit 205A includes a normal memory array 210A and a control circuit 220A, and the control circuit 220A includes a sub control circuit 230A, a word line circuit 250A and a bit line circuit 270A. In the connection relationship, the sub control circuit 230A is connected to the word line circuit 250A and the bit line circuit 270A, and the normal memory array 210A is connected to the word line circuit 250A and the bit line circuit 270A.

Similarly, the normal memory circuit 205B includes the normal memory array 210B and the control circuit 220B, and the control circuit 220B includes the sub control circuit 230B, the word line circuit 250B and the bit line circuit 270B. In the connection relationship, the sub control circuit 230B is connected to the word line circuit 250B and the bit line circuit 270B, and the normal memory array 210B is connected to the word line circuit 250B and the bit line circuit 270B. The normal memory circuit 205C includes the normal memory array 210C and the control circuit 220C, and the control circuit 220C includes the sub control circuit 230C, the word line circuit 250C and the bit line circuit 270C. In the connection relationship, the sub control circuit 230C is connected to the word line circuit 250C and the bit line circuit 270C, and the normal memory array 210C is connected to the word line circuit 250C and the bit line circuit 270C.

On the other hand, the redundant memory circuit 205D includes the normal memory array 210D and the control circuit 220D, and the control circuit 220D includes the sub control circuit 230D, the word line circuit 250D and the bit line circuit 270D. In the connection relationship, the sub control circuit 230D is connected to the word line circuit 250D and the bit line circuit 270D, and the normal memory array 210D is connected to the word line circuit 250D and the bit line circuit 270D.

Furthermore, all of the normal memory circuits 205A to 205C and the redundant memory circuit 205D are connected to the data buffer circuit 290. The normal memory circuits 205A to 205C share the redundant memory circuit 205D.

The detailed operation method of the memory device 200 in FIG. 2 will be explained with reference to FIG. 3 below.

Figure 3:
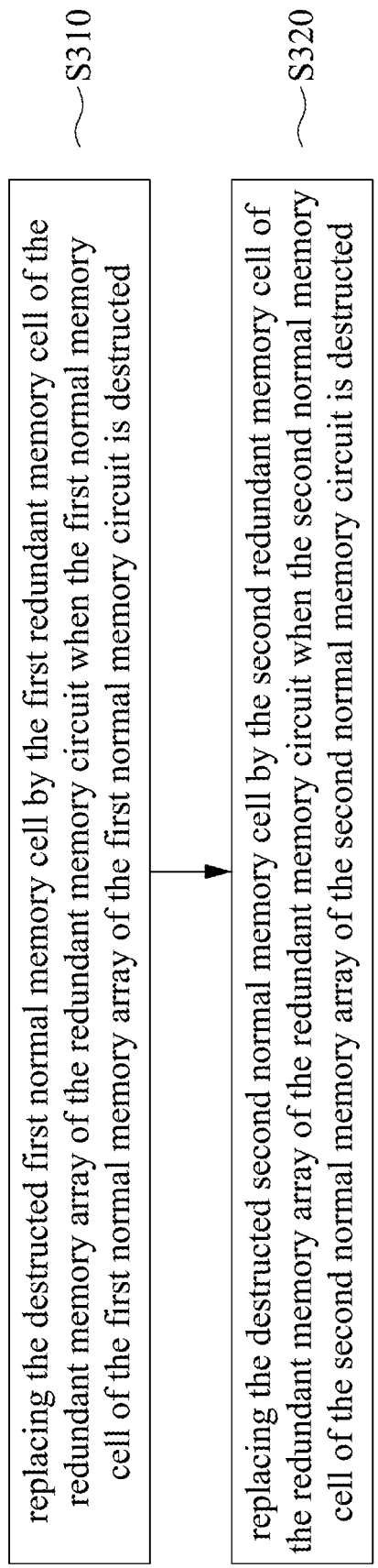
FIG. 3 is a flow chart illustrating a repair method according to some embodiments of the present disclosure.

Reference is made to FIG. 3. FIG. 3 is a flow chart illustrating a repair method 300 according to some embodiments of the present disclosure.

In operation S310, when the first normal memory cell of the first normal memory array of the first normal memory circuit is destructed, the first redundant memory cell of the redundant memory array of the redundant memory circuit replaces the destructed first normal memory cell.

In operation S320, when the second normal memory cell of the second normal memory array of the second normal memory circuit is destructed, the second redundant memory cell of the redundant memory array of the redundant memory circuit replaces the destructed second normal memory cell.

For example, reference is made to FIG. 2 at the same time. When the normal memory cell located at the normal memory column 212A of the normal memory array 210A is destructed, the redundant memory cell in the redundant memory column 214A of the redundant memory array 210D replaces the destructed normal memory cell in the normal memory column 212A of the normal memory array 210A. When the normal memory cell located at the normal memory column 212B of the normal memory array 210B is destructed, the redundant memory cell of the redundant memory column 214B of the redundant memory array 210D replaces the destructed normal memory cell of normal memory column 212B of the normal memory array 210B. Furthermore, when the normal memory cell located at the normal memory column 212C of the normal memory array 210C is destructed, the redundant memory cell of the redundant memory column 214C of the redundant memory array 210D replaces the destructed normal memory cell in the normal memory column 212C of the normal memory array 210C.

The data buffer circuit 290 is configured to integrate the normal memory circuits 205A to 205C and the redundant memory circuit 205D.

Figure 4:
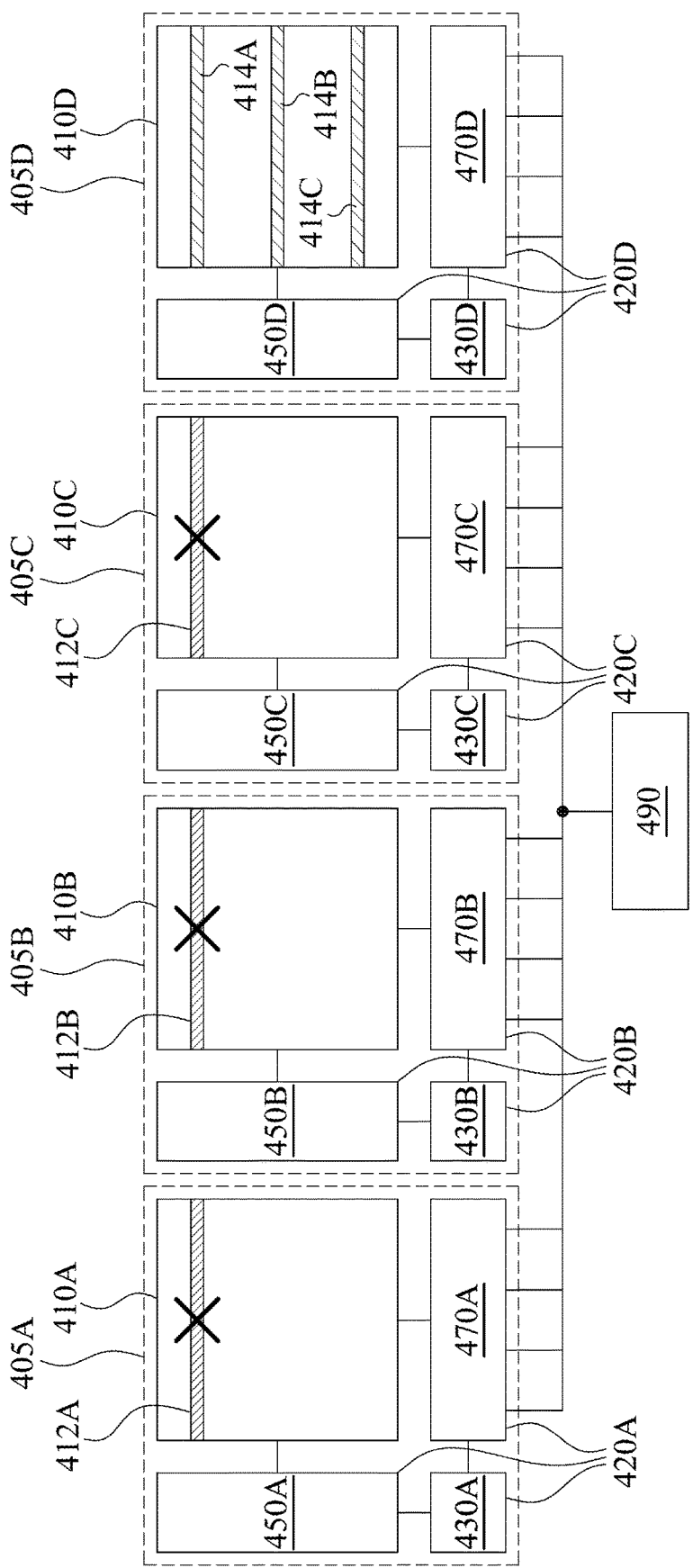
FIG. 4 is a schematic diagram illustrating another memory device according to some embodiments of the present disclosure.
Figure 5:
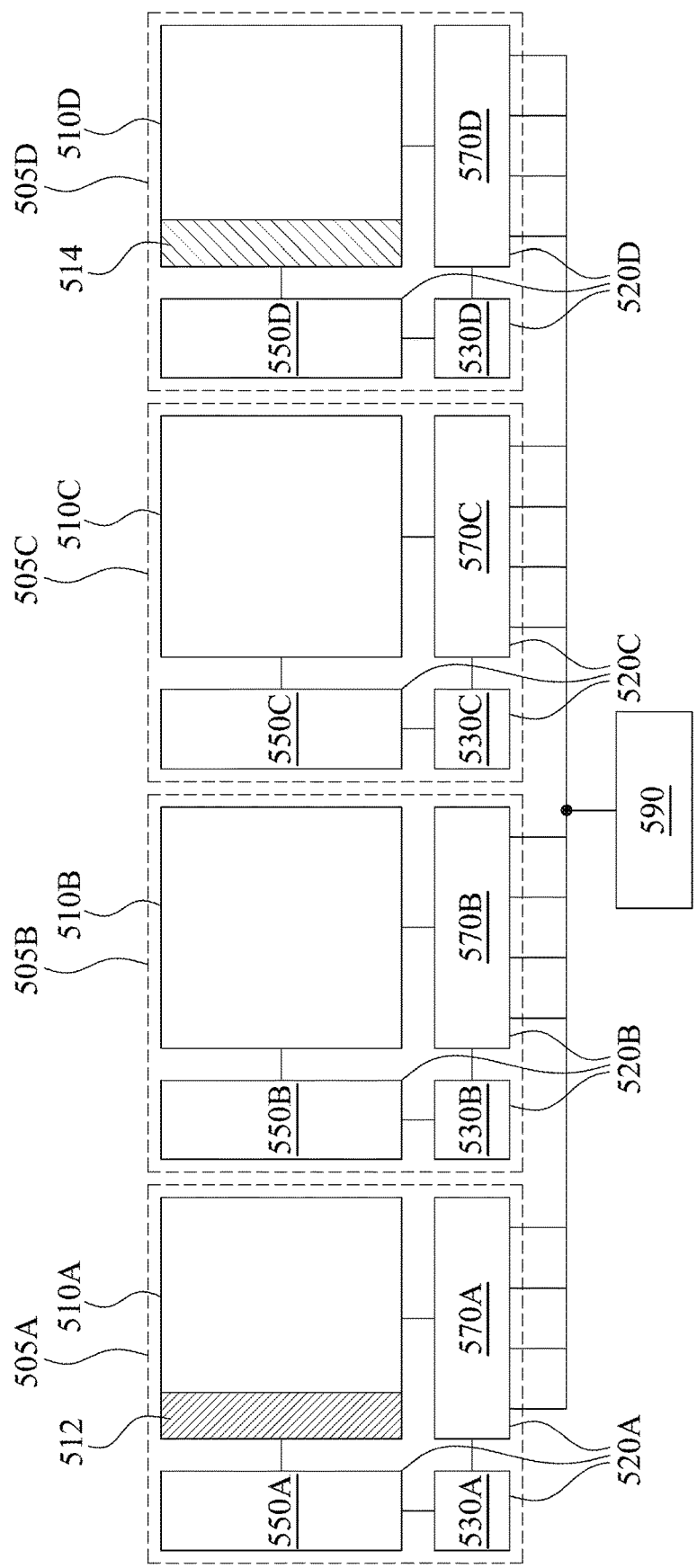
FIG. 5 is a schematic diagram illustrating another memory device according to some embodiments of the present disclosure.
Figure 6:
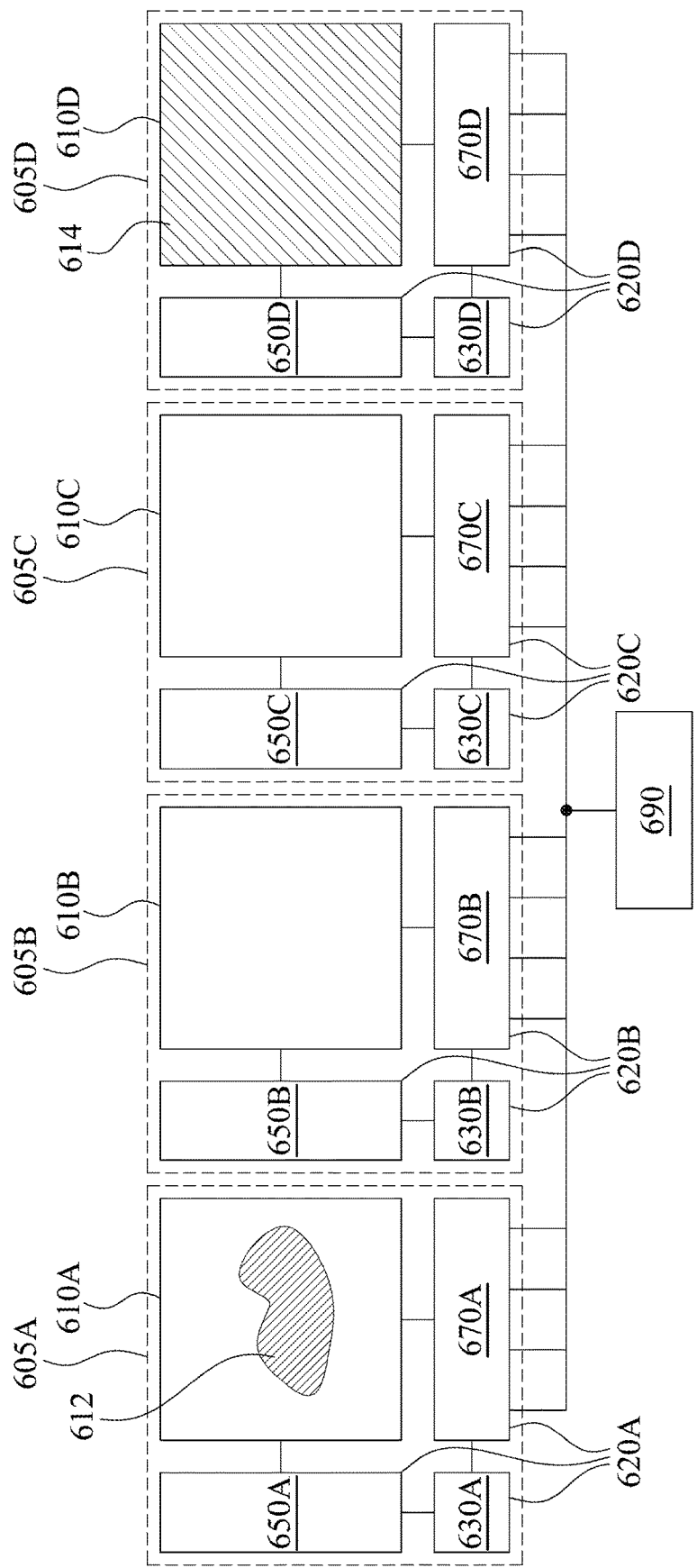
FIG. 6 is a schematic diagram illustrating another memory device according to some embodiments of the present disclosure.

In some embodiments, the repair method 300 as illustrated in FIG. 3 is also applicable to the memory devices 400 to 600 shown in FIG. 4 to FIG. 6.

In some embodiments, as illustrated in FIG. 2, when the destructed normal memory cell of the normal memory array is located at the memory column of the normal memory array, the redundant memory column of the redundant memory array replaces the memory column of the normal memory array.

In some embodiments, for different normal memory circuits, the replacement is operated by different redundant memory columns of the redundant memory circuit. In detail, for the normal memory cell of the normal memory circuit 205A, the replacement is operated by the redundant memory column 214A of the redundant memory circuit 205D. For the normal memory cell of the normal memory circuit 205B, the replacement is operated by the redundant memory column 214B of the redundant memory circuit 205D. For the normal memory cell of the normal memory circuit 205C, the replacement is operated by the redundant memory column 214C of the redundant memory circuit 205D.

In some other embodiments, when the destructed normal memory cell of the normal memory array is located at the normal memory row of the normal memory array, the redundant memory row of the redundant memory array replaces the normal memory row of the normal memory array.

Reference is made FIG. 4 at the same time. FIG. 4 is a schematic diagram illustrating another memory device 400 according to some embodiments of the present disclosure.

As illustrated in FIG. 4. The memory device 400 includes several normal memory circuits 405A to 405C and the redundant memory circuit 405D. The normal memory circuit 405A includes the normal memory array 410A and the control circuit 420A, and the control circuit 420A includes the sub control circuit 430A, the word line circuit 450A and the bit line circuit 470A. In the connection relationship, the sub control circuit 430A is connected to the word line circuit 450A and the bit line circuit 470A, and the normal memory array 410A is connected to the word line circuit 450A and the bit line circuit 470A.

Similarly, the normal memory circuit 405B includes the normal memory array 410B and the control circuit 420B, and the control circuit 420B includes the sub control circuit 430B, the word line circuit 450B and the bit line circuit 470B. In the connection relationship, the sub control circuit 430B is connected to the word line circuit 450B and the bit line circuit 470B, and the normal memory array 410B is connected to the word line circuit 450B and the bit line circuit 470B. The normal memory circuit 405C includes the normal memory array 410C and the control circuit 420C, and the control circuit 420C includes the sub control circuit 430C, the word line circuit 450C and the bit line circuit 470C. In the connection relationship, the sub control circuit 430C is connected to the word line circuit 450C and the bit line circuit 470C, and the normal memory array 410C is connected to the word line circuit 450C and the bit line circuit 470C.

On the other hand, the redundant memory circuit 405D includes the normal memory array 410D and the control circuit 420D, and the control circuit 420D includes the sub control circuit 430D, the word line circuit 450D and the bit line circuit 470D. In the connection relationship, the sub control circuit 430D is connected to the word line circuit 450D and the bit line circuit 470D, and the normal memory array 410D is connected to the word line circuit 450D and the bit line circuit 470D.

Furthermore, the normal memory circuits 405A to 405C and the redundant memory circuit 405D are connected to the data buffer circuit 490. The normal memory circuits 405A to 405C share redundant memory circuit 405D.

When the normal memory cell located at the memory row 412A of the normal memory array 410A is destructed, the redundant memory cell of the redundant memory row 414A of the redundant memory array 410D replaces the destructed normal memory cell of the normal memory row 412A of the normal memory array 410A. When the normal memory cell located at the normal memory row 412B of the normal memory array 410B is destructed, the redundant memory cell of the redundant memory row 414B of the redundant memory array 410D replaces the destructed normal memory cell of the normal memory row 412B of the normal memory array 410B. Furthermore, when the normal memory cell located at the normal memory row 412C of the normal memory array 410C is destructed, the redundant memory cell of the redundant memory row 414C of the redundant memory array 410D replaces the destructed normal memory cell of the normal memory row 412C of the normal memory array 410C.

The data buffer circuit 490 is configured to integrate the normal memory circuits 405A to 405C and the redundant memory circuit 405D.

In some embodiments, for different normal memory circuits, replacement is operated by different memory rows of the redundant memory circuit. In detail, for the normal memory cell of the normal memory circuit 405A, replacement is operated by the redundant memory row 414A of the redundant memory circuit 405D. For the normal memory cell of the normal memory circuit 405B, the replacement is operated by the redundant memory row 414B of the redundant memory circuit 405D. For the normal memory cell of the normal memory circuit 405C, the replacement is operated by the redundant memory row 414C of the redundant memory circuit 405D.

In some embodiments, when the normal memory circuit includes more lines of the destructed normal memory cells, the compensation is operated by the several columns of the redundant memory cells of the redundant memory circuit. The following explanation is illustrated with reference to FIG. 5.

FIG. 5 is a schematic diagram illustrating another memory device 500 according to some embodiments of the present disclosure.

As illustrated in FIG. 5. The memory device 500 includes several normal memory circuits 505A to 505C and the redundant memory circuit 505D. The normal memory circuit 505A includes the normal memory array 510A and the control circuit 520A, and the control circuit 520A includes the sub control circuit 530A, the word line circuit 550A and the bit line circuit 570A. In the connection relationship, the sub control circuit 530A is connected to the word line circuit 550A and the bit line circuit 570A, and the normal memory array 510A is connected to the word line circuit 550A and the bit line circuit 570A.

Similarly, the normal memory circuit 505B includes the normal memory array 510B and the control circuit 520B, and the control circuit 520B includes the sub control circuit 530B, the word line circuit 550B and the bit line circuit 570B. In the connection relationship, the sub control circuit 530B is connected to the word line circuit 550B and the bit line circuit 570B, and the normal memory array 510B is connected to the word line circuit 550B and the bit line circuit 570B. The normal memory circuit 505C includes the normal memory array 510C and the control circuit 520C, and the control circuit 520C includes the sub control circuit 530C, the word line circuit 550C and the bit line circuit 570C. In the connection relationship, the sub control circuit 530C is connected to the word line circuit 550C and the bit line circuit 570C, and the normal memory array 510C is connected to the word line circuit 550C and the bit line circuit 570C.

On the other hand, the redundant memory circuit 505D includes the normal memory array 510D and the control circuit 520D, and the control circuit 520D includes the sub control circuit 530D, the word line circuit 550D and the bit line circuit 570D. In the connection relationship, the sub control circuit 530D is connected to the word line circuit 550D and the bit line circuit 570D, and the normal memory array 510D is connected to the word line circuit 550D and the bit line circuit 570D.

Furthermore, the normal memory circuits 505A to 505C and the redundant memory circuit 505D are all connected to the data buffer circuit 590. The normal memory circuits 505A to 505C share the redundant memory circuit 505D. The data buffer circuit 590 is configured to integrate the normal memory circuits 505A to 505C and the redundant memory circuit 505D.

As illustrated in FIG. 5, when several columns of the normal memory column 512 of the normal memory array 510A are destructed, the replacement is operated by the several columns of the redundant memory column 514 of the redundant memory array 510D.

Similarly, in some other embodiments, when several rows of the normal memory rows of the normal memory array are destructed, the replacement is operated by the several rows of the redundant memory rows of the redundant memory array.

In some embodiments, when the normal memory array includes the destructed several normal memory columns, and the column number of the destructed several normal memory columns is larger than the threshold value, the redundant memory array replaces the normal memory array. In some other embodiments, when the normal memory array includes several destructed normal memory rows, and the row number of the several destructed normal memory rows is larger than the threshold value, the redundant memory array replaces the normal memory array.

For example, reference is made to FIG. 6 at the same time. FIG. 6 is a schematic diagram illustrating another memory device 600 according to some embodiments of the present disclosure.

As illustrated in FIG. 6. The memory device 600 includes several normal memory circuits 605A to 605C and the redundant memory circuit 605D. The normal memory circuit 605A includes the normal memory array 610A and the control circuit 620A, and the control circuit 620A includes the sub control circuit 630A, the word line circuit 650A and the bit line circuit 670A. In the connection relationship, the sub control circuit 630A is connected to the word line circuit 650A and the bit line circuit 670A, and the normal memory array 610A is connected to the word line circuit 650A and the bit line circuit 670A.

Similarly, the normal memory circuit 605B includes the normal memory array 610B and the control circuit 620B, and the control circuit 620B includes the sub control circuit 630B, the word line circuit 650B and the bit line circuit 670B. In the connection relationship, the sub control circuit 630B is connected to the word line circuit 550B and the bit line circuit 670B, and the normal memory array 610B is connected to the word line circuit 650B and the bit line circuit 670B. The normal memory circuit 605C includes the normal memory array 610C and the control circuit 620C, and the control circuit 620C includes the sub control circuit 630C, the word line circuit 650C and the bit line circuit 670C. In the connection relationship, the sub control circuit 630C is connected to the word line circuit 650C and the bit line circuit 670C, and the normal memory array 610C is connected to the word line circuit 650C and the bit line circuit 670C.

On the other hand, the redundant memory circuit 605D includes the normal memory array 610D and the control circuit 620D, and the control circuit 620D includes the sub control circuit 630D, the word line circuit 650D and the bit line circuit 670D. In the connection relationship, the sub control circuit 630D is connected to the word line circuit 650D and the bit line circuit 670D, and the normal memory array 610D is connected to the word line circuit 650D and the bit line circuit 670D.

Furthermore, the normal memory circuits 605A to 605C and the redundant memory circuit 605D are all connected to the data buffer circuit 690. The normal memory circuits 605A to 605C share the redundant memory circuit 605D. The data buffer circuit 690 is configured to integrate the normal memory circuits 605A to 605C and the redundant memory circuit 605D.

As illustrated in FIG. 6, the normal memory array 610A includes larger area of destructed memory. For example, the normal memory in the area 612 is destructed. When the column number of the destructed normal memory of the memory array 610A is larger than the threshold value, all of the redundant memory cells 614 of the redundant memory array 610D replace the normal memory array 610A.

Based on the aforementioned embodiments, the present disclosure provides a memory device and a repair method thereof. Since several memory circuits share the redundant memory circuit, the allocation of the redundant memory cell is more flexible. Furthermore, the problem of insufficient redundant memory cells when there are more destructed normal memory cells may also be improved.

It should be noted that, in the embodiments of the present disclosure, the control circuit 220A can only control the normal memory array 210A, the control circuit 220B can only control the normal memory array 210B, the control circuit 220C can only control the normal memory array 210C, the control circuit 220D can only control the redundant memory array 210D, the rest and so on.

Furthermore, the numbers of the memory columns, the memory rows, the memory circuits, etc. mentioned above are for illustrative purposes only, and the embodiments of the present disclosure are not limited thereto.

Various functional elements and blocks have been disclosed herein. For those skilled in the art, the functional blocks can be implemented by circuits (whether dedicated circuits or general-purpose circuits operated under the control of one or more processors and coded instructions), which generally include is configured to a transistor or other circuit elements that controls the operation of an electrical circuit corresponding to the functions and operations described here. As will be further understood, in general, the specific structure and interconnection of circuit elements can be determined by a compiler (compiler), such as a temporarily stored transfer language (Register Transfer Language, RTL) compiler. The temporarily stored transfer language compiler operates on scripts that are quite similar to assembly language codes, and compiles the scripts into a form for layout or making final circuits. Indeed, temporarily stored delivery language is well-known for its role and use in promoting the design of electronic and digital systems.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A memory device, comprising:
 a plurality of normal memory circuits, comprising a plurality of normal memory arrays; and
 a redundant memory circuit, comprising a redundant memory array, wherein the plurality of normal memory arrays share the redundant memory array;
 wherein when a first normal memory cell of a first normal memory array of the plurality of normal memory arrays is destructed, a first redundant memory cell of the redundant memory array replaces the first normal memory cell;
 wherein when a second normal memory cell of a second normal memory array of the plurality of normal memory arrays is destructed, a second redundant memory cell of the redundant memory array replaces the second normal memory cell; and
 wherein when a plurality of normal memory columns of the first normal memory array is destructed, and a column number of the plurality of normal memory columns is larger than a threshold value, the redundant memory array replaces the first normal memory array, wherein the threshold value is less than the total number of columns of the first normal memory array.

2. The memory device of claim 1, wherein when the first normal memory cell is located at a first normal memory row of the first normal memory array, a first redundant memory row of the redundant memory array replaces the first normal memory row.

3. The memory device of claim 1, wherein when the first normal memory cell is located at a first normal memory column of the first normal memory array, a first redundant memory column of the redundant memory array replaces the first normal memory column.

4. The memory device of claim 1, wherein the first redundant memory cell and the second redundant memory cell are located at different columns.

5. The memory device of claim 1, wherein the first redundant memory cell and the second redundant memory cell are located at different rows.

6. A repair method, suitable for a memory device, wherein the memory device comprises a first normal memory circuit, a second normal memory circuit and a redundant memory circuit, wherein the repair method comprises:
   replacing a first normal memory cell by a first redundant memory cell of a redundant memory array of the redundant memory circuit when the first normal memory cell of a first normal memory array of the first normal memory circuit is destructed;
   replacing a second normal memory cell by a second redundant memory cell of the redundant memory array when the second normal memory cell of a second normal memory array of the second normal memory circuit is destructed, wherein the first normal memory circuit and the second normal memory circuit share the redundant memory circuit; and
   replacing the first normal memory array by the redundant memory array when an area of the first normal memory array is destructed, wherein a column number of a plurality of normal memory columns comprised in the area is larger than a threshold value, wherein the threshold value is less than the total number of columns of the first normal memory array.

7. The repair method of claim 6, wherein the first redundant memory cell and the second redundant memory cell are located at different columns.

8. The repair method of claim 6, wherein when a plurality of normal memory columns of a third normal memory array of the plurality of normal memory arrays is destructed, a plurality of redundant memory columns of the redundant memory array replace the plurality of normal memory columns of the third normal memory array.

* * * * *